United States Patent
Cadag et al.

(10) Patent No.: US 12,543,575 B2
(45) Date of Patent: Feb. 3, 2026

(54) BOTTOM PACKAGE EXPOSED DIE MEMS PRESSURE SENSOR INTEGRATED CIRCUIT PACKAGE DESIGN

(71) Applicant: STMICROELECTRONICS, INC., Calamba (PH)

(72) Inventors: Aaron Cadag, Calamba (PH); Frederick Arellano, Cabuyao (PH); Ernesto Antilano, Jr., Binan Laguna (PH)

(73) Assignee: STMICROELECTRONICS, INC., Calamba (PH)

( * ) Notice: Subject to any disclaimer, the term of this patent is extended or adjusted under 35 U.S.C. 154(b) by 835 days.

(21) Appl. No.: 17/752,567

(22) Filed: May 24, 2022

(65) Prior Publication Data
US 2022/0285249 A1   Sep. 8, 2022

Related U.S. Application Data

(62) Division of application No. 16/584,405, filed on Sep. 26, 2019, now Pat. No. 11,355,423, which is a
(Continued)

(51) Int. Cl.
*H01L 23/495* (2006.01)
*B81B 7/00* (2006.01)
(Continued)

(52) U.S. Cl.
CPC ...... *H01L 23/49541* (2013.01); *B81B 7/0058* (2013.01); *B81C 1/00825* (2013.01);
(Continued)

(58) Field of Classification Search
CPC .......... B81B 7/0058; B81B 2201/0264; B81B 2207/012; B81B 2207/098; B81C 2203/01; B81C 2203/032; B81C 2203/0792
See application file for complete search history.

(56) References Cited

U.S. PATENT DOCUMENTS 9,236,275 B2    1/2016  Yeh et al.
2004/0259288 A1* 12/2004 Mostafazadeh ... H01L 23/49548
                                             257/E21.503
(Continued)

FOREIGN PATENT DOCUMENTS

| CN | 101256966 A | 9/2008 |
| CN | 102158775 A | 8/2011 |
| CN | 104661164 A | 5/2015 |

*Primary Examiner* — Marcos D. Pizarro
(74) *Attorney, Agent, or Firm* — Seed IP Law Group LLP

(57) ABSTRACT

A MEMS pressure sensor packaged with a molding compound. The MEMS pressure sensor features a lead frame, a MEMS semiconductor die, a second semiconductor die, multiple pluralities of bonding wires, and a molding compound. The MEMS semiconductor die has an internal chamber, a sensing component, and apertures. The MEMS semiconductor die and the apertures are exposed to an ambient atmosphere. A method is desired to form a MEMS pressure sensor package that reduces defects caused by mold flashing and die cracking. Fabrication of the MEMS pressure sensor package comprises placing a lead frame on a lead frame tape; placing a MEMS semiconductor die adjacent to the lead frame and on the lead frame tape with the apertures facing the tape and being sealed thereby; attaching a second semiconductor die to the MEMS semiconductor die; attaching pluralities of bonding wires to form electrical connections between the MEMS semiconductor die, the second semiconductor die, and the lead frame; and forming a molding compound.

20 Claims, 7 Drawing Sheets

Related U.S. Application Data division of application No. 15/212,107, filed on Jul. 15, 2016, now Pat. No. 10,483,191.

(51) Int. Cl.
  *B81C 1/00* (2006.01)
  *H01L 21/56* (2006.01)
  *H01L 23/00* (2006.01)
  *H01L 23/31* (2006.01)

(52) U.S. Cl.
  CPC .......... *H01L 21/565* (2013.01); *H01L 21/566* (2013.01); *H01L 21/568* (2013.01); *H01L 23/3114* (2013.01); *H01L 23/49575* (2013.01); *H01L 24/32* (2013.01); *H01L 24/49* (2013.01); *H01L 24/73* (2013.01); *H01L 24/83* (2013.01); *H01L 24/85* (2013.01); *H01L 24/92* (2013.01); *B81B 2201/0264* (2013.01); *B81B 2207/012* (2013.01); *B81B 2207/07* (2013.01); *B81B 2207/098* (2013.01); *B81C 2203/01* (2013.01); *B81C 2203/032* (2013.01); *B81C 2203/0792* (2013.01); *H01L 24/45* (2013.01); *H01L 24/48* (2013.01); *H01L 2224/16245* (2013.01); *H01L 2224/2919* (2013.01); *H01L 2224/32145* (2013.01); *H01L 2224/45147* (2013.01); *H01L 2224/48091* (2013.01); *H01L 2224/48106* (2013.01); *H01L 2224/48145* (2013.01); *H01L 2224/48229* (2013.01); *H01L 2224/48247* (2013.01); *H01L 2224/4911* (2013.01); *H01L 2224/49171* (2013.01); *H01L 2224/49175* (2013.01); *H01L 2224/73253* (2013.01); *H01L 2224/73265* (2013.01); *H01L 2224/92247* (2013.01); *H01L 2924/1461* (2013.01); *H01L 2924/17747* (2013.01); *H01L 2924/181* (2013.01); *H01L 2924/19107* (2013.01)

(56) References Cited

U.S. PATENT DOCUMENTS

| | | |
|---|---|---|
| 2005/0093117 A1 | 5/2005 | Masuda et al. |
| 2008/0036053 A1 | 2/2008 | Wu et al. |
| 2008/0217765 A1 | 9/2008 | Yoder et al. |
| 2010/0072586 A1 | 3/2010 | Merilo et al. |
| 2011/0175179 A1 | 7/2011 | Chiu et al. |
| 2012/0027234 A1 | 2/2012 | Goida |
| 2012/0266684 A1 | 10/2012 | Hooper et al. |
| 2014/0061892 A1* | 3/2014 | Ziglioli .............. H04R 1/086 438/126 |
| 2014/0353772 A1 | 12/2014 | Stermer, Jr. et al. |
| 2014/0374852 A1* | 12/2014 | Raleigh .............. B81C 1/0023 438/51 |
| 2015/0146894 A1 | 5/2015 | Ng |
| 2016/0159640 A1* | 6/2016 | Gurin .............. B81B 7/0058 257/415 |
| 2016/0169758 A1 | 6/2016 | Hooper et al. |
| 2017/0081179 A1 | 3/2017 | Dawson et al. |

\* cited by examiner

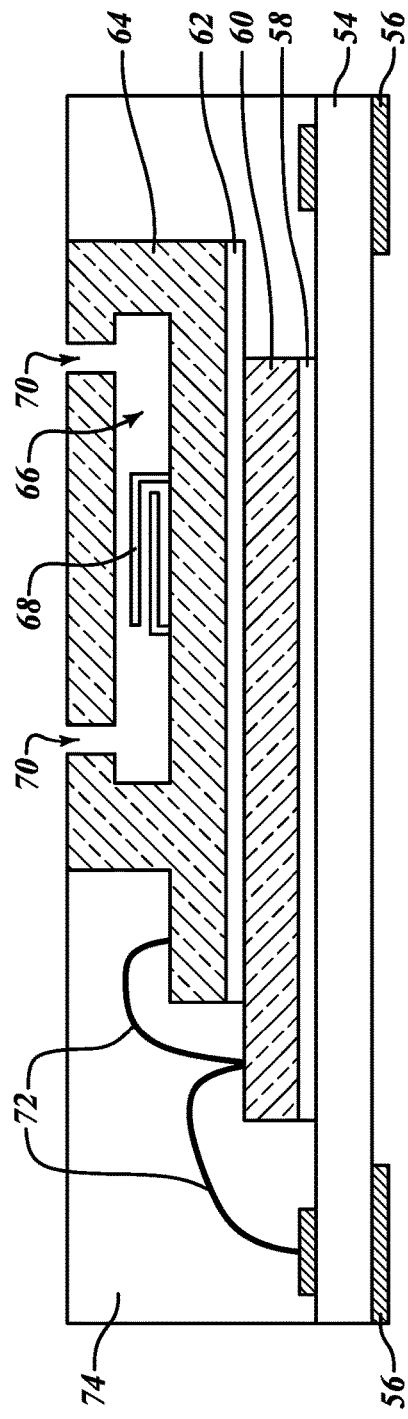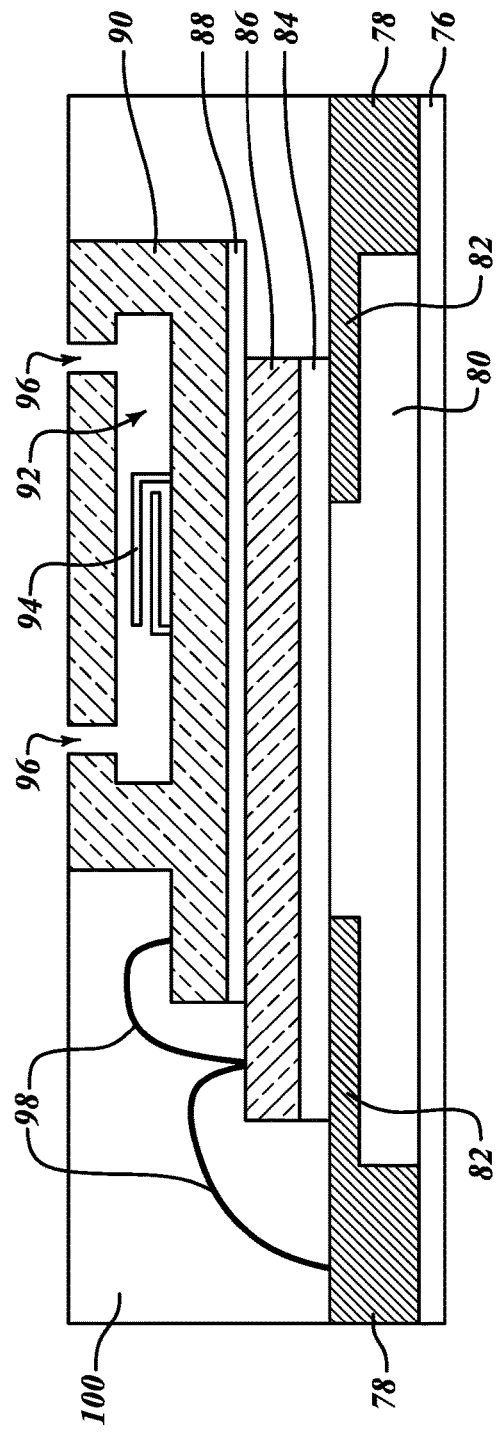

BOTTOM PACKAGE EXPOSED DIE MEMS PRESSURE SENSOR INTEGRATED CIRCUIT PACKAGE DESIGN

BACKGROUND

Technical Field

The present disclosure generally relates to MEMS (Microelectromechanical Systems) packages fabricated using a lead frame tape to form a MEMS package with holes that expose a sensing component to an outside environment, and more particularly to such a package that can be reliably formed with few failures and reduced opportunities for packaging errors.

Description of the Related Art

As consumer demand increases for smaller multifunction devices, manufacturers face significant challenges to maintain a method to produce several small MEMS devices in packages without defects. MEMS devices exist to combine mechanical structures with electronic devices to form electronically responsive moving parts for use as miniature sensors and actuators. MEMS packages must protect both the electronic connections and sensitive components in the MEMS devices. For example, as electronics are exposed to an ambient atmosphere, such as an outside environment, manufacturers look for ways to produce MEMS devices efficiently and built to withstand external stresses. FIGS. 11 and 12 show two separate conventional MEMS packages that are designed to protect MEMS devices' internal components and electronic connections from the environment in which they will be used; yet, these prior art packages have a variety of shortcomings that make them high in cost to produce and often result in lower yields of working parts than desired.

BRIEF SUMMARY

MEMS pressure sensor packages are fabricated by using a lead frame tape as a base layer and a MEMS die having a side with apertures in contact with the lead frame tape. One or more additional semiconductor dice are coupled to the lead frame tape and the entire assembly is encased in molding compound. In one embodiment, a method used to form the package results in a MEMS pressure sensor package having a lead frame and a MEMS semiconductor die exposed to an ambient atmosphere. In this embodiment, the lead frame is placed on a first side of a lead frame tape. After the placement of the lead frame, a MEMS semiconductor die is then placed on the first side of the lead frame tape adjacent to the lead frame. The lead frame tape seals and protects any apertures of the MEMS semiconductor die that will ultimately be open to the ambient environment in the end product. The placement of the MEMS semiconductor die is followed by attaching a second semiconductor die to the MEMS semiconductor die using an adhesive film. Once the MEMS semiconductor die and the second semiconductor dice are in place, a plurality of bonding wires are added to connect the lead frame, the MEMS semiconductor die, and the second semiconductor die in the MEMS device. Finally, a molding compound is applied to partially cover the lead frame and the MEMS semiconductor die. In addition, the molding compound is applied to completely encapsulate the plurality of bonding wires and the second semiconductor die. Thus, the molding compound protects the sensitive and fragile electronic connections from the outside environment and helps protect the sensing components and dice from external stresses.

In one embodiment, the MEMS semiconductor die comprises an internal chamber, a sensing component inside the internal chamber, and apertures that expose the internal chamber to the ambient air. The apertures are exposed to the ambient atmosphere to permit the internal chamber and sensing component contained therein to receive the ambient atmosphere.

In one embodiment, the lead frame is placed on the opposite side of the MEMS package from the MEMS semiconductor die, and a plurality of bonding wires connect the lead frame to the second semiconductor die.

In one embodiment, the lead frame is placed on the opposite side of the MEMS package from the MEMS semiconductor die, and the plurality of bonding wires are omitted and replaced with solder ball or metal pillar connectors. The solder ball or metal pillar connectors connect the lead frame to the second semiconductor die.

BRIEF DESCRIPTION OF THE SEVERAL VIEWS OF THE DRAWINGS

For a better understanding of the invention, an embodiment thereof will now be described, by way of non-limiting examples and with reference to the attached drawings.

FIG. 11 is a cross-sectional side view of a prior art MEMS package.

FIG. 12 is a cross-sectional side view of a different prior art MEMS package.

DETAILED DESCRIPTION

Reference throughout this specification to "one embodiment" or "alternative embodiment" means that a particular feature, structure or characteristic described in connection with the embodiment is included in at least one embodiment. Thus, the appearances of the phrases "in one embodiment" or "the alternative embodiment" in various places throughout this specification are not necessarily all referring to the same embodiment.

The use of ordinals such as first, second and third does not necessarily imply a ranked sense of order, but rather may only distinguish between multiple instances of an act or structure.

The headings and Abstract of the Disclosure provided herein are for convenience only and do not modify the scope or meaning of the embodiments.

Figure 1:
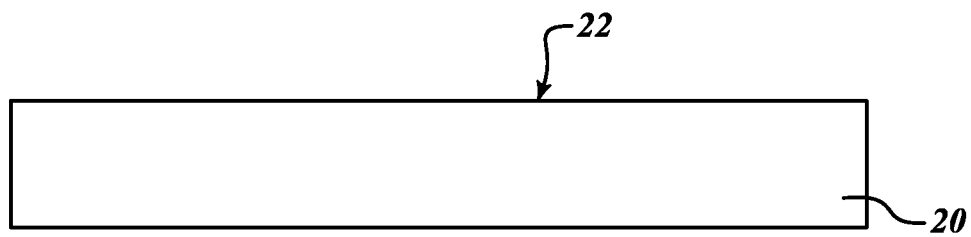
FIGS. 1-6 are cross-sectional side views of a MEMS pressure sensor packaging at successive steps of a MEMS package fabrication process according to embodiments disclosed herein.

FIG. 1 is a side view of a lead frame tape 20. The lead frame tape 20 has a first side 22. The lead frame tape 20 may be made of one or more layers of non-conductive adhesive and polyimide material.

In this embodiment, the lead frame tape 20 is positioned at the bottom of the package as a base layer during fabrication. Using the lead frame tape 20 as a base layer during fabrication reduces the amount of material needed to produce a MEMS package, as the lead frame tape 20 replaces a substrate base layer 54 (FIG. 11) or a molding compound base layer 80 (FIG. 12), and the lead frame tape 20 can easily be removed at the end of a fabrication process. Utilizing a lead frame tape as a base layer allows the manufacturer or producer to fabricate a thinner MEMS package.

Figure 2:
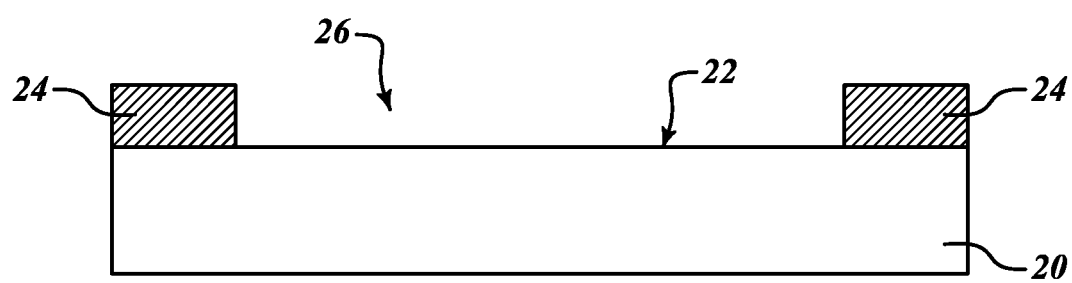

FIG. 2 is a cross-sectional side view of a lead frame 24 placed on the first side 22 of the lead frame tape 20. The lead frame 24 has an open region 26 in the middle of it. The open region 26 may be of any shape and size, and the open region 26 may be an open space, open area, open volume, or some other form of an opening. The lead frame 24 may be composed of conductive material such as a copper, a copper-alloy, or some other conductive material known in the semiconductor industry. The lead frame 24 is placed in a manner such that the open region 26 is located above the first side 22 of the lead frame tape 20.

Figure 3:
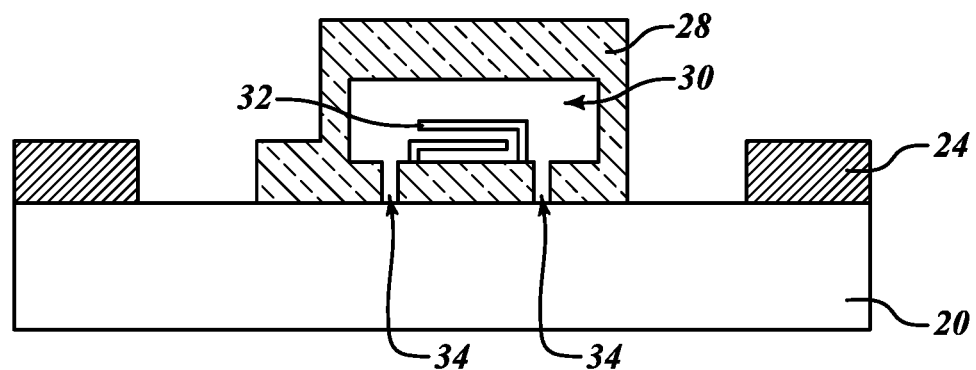

FIG. 3 is a cross-sectional side view showing a first MEMS semiconductor die 28 placed on the first side 22 of the lead frame tape 20 in the center of the open region 26 of the lead frame 24. The MEMS semiconductor die 28 is placed adjacent to the lead frame 24. The MEMS semiconductor die 28 may be a MEMS die, a MEMS pressure sensor die, or some other die known in the semiconductor industry. The MEMS semiconductor die 28 has an internal chamber 30, a sensing component 32, and a plurality of apertures 34. The internal chamber 30 contains the sensing component 32. The sensing component 32 may be configured to measure pressure. The MEMS semiconductor die 28 is placed in a manner such that the apertures 34 face the first side 22 of the lead frame tape 20. The lead frame tape 20 sealing the apertures 34.

In this embodiment, the MEMS semiconductor die 28 is placed directly on the first side 22 of the lead frame tape 20. Placing the MEMS semiconductor die 28 directly onto the lead frame tape 20 reduces the amount of material needed to produce the lead frame 24, as the lead frame tape 20 supports the MEMS semiconductor die 28 instead of the lead frame 24. In addition, the placement of the MEMS semiconductor die 28 directly on the lead frame tape 20 in a manner such that the apertures 34 face the lead frame tape 20 permits the tape to both seal and protect the internal chamber 30. Doing this reduces defects caused by mold flashing during the later molding process. Mold flashing results when a molding compound 46 (FIG. 6) is distributed incorrectly and covers the apertures 34 during the formation of a MEMS pressure sensor package. Utilizing a lead frame tape as a base layer to protect and cover apertures of a MEMS semiconductor die reduces the chances of mold flashing defects.

Figure 4:
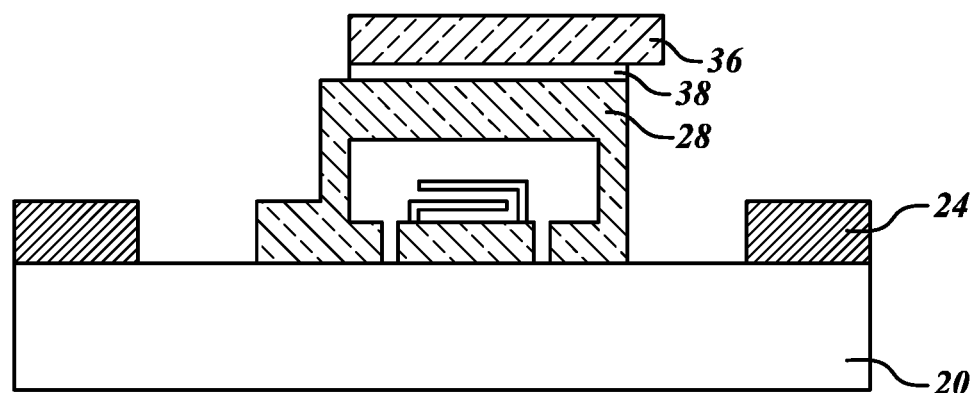

FIG. 4 is a cross-sectional side view showing a second semiconductor die 36 attached to the MEMS semiconductor die 28 by an adhesive film 38. The second semiconductor die 36 may be an integrated circuit, such as an ASIC (Application Specific Integrated Circuit) or some other integrated circuit known in the semiconductor industry. The adhesive film 38 may be a standard DAF (Die Attach Film) of the type known in the prior art or some other attachment material known in the semiconductor industry.

Figure 5:
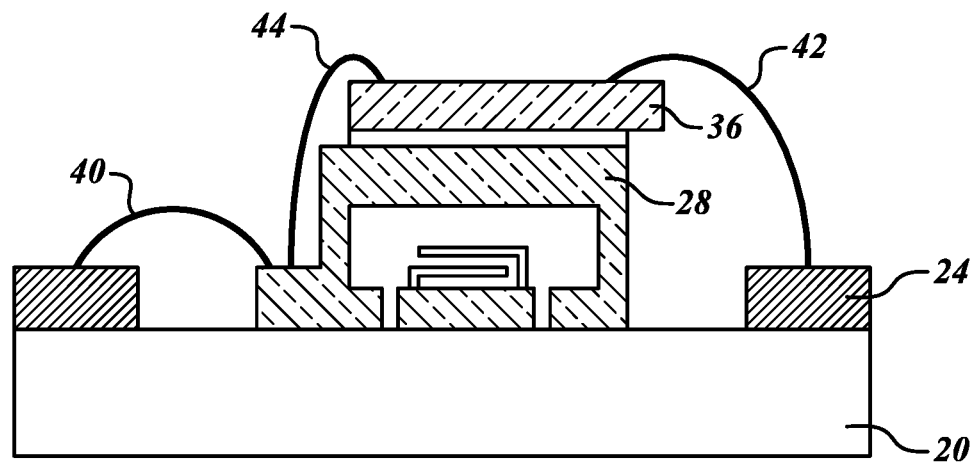

FIG. 5 is a cross-sectional side view showing multiple pluralities of bonding wires 40, 42, 44. The first plurality of bonding wires 44 has a first end connected to the MEMS semiconductor die 28 and a second end connected to the second semiconductor die 36. The second plurality of bonding wires 42 has a first end connected to the lead frame 24 and a second end connected to at least the MEMS semiconductor die 28 or the second semiconductor die 36. The third plurality of bonding wires 40 has a first end connected to the lead frame 24 and a second end connected to the MEMS semiconductor die 28 or the second semiconductor die 36, whichever is without a connection to the lead frame 24. The first, second, and third plurality of bonding wires 40, 42, 44 may be standard copper wires or any wire bond interconnects attached using known standard techniques suitable in the semiconductor industry.

In this embodiment, three pluralities of bonding wires 40, 42, 44 are used. Using these pluralities of bonding wires 40, 42, 44 instead of a first and second plurality of bonding wires 72, 98 (FIGS. 11 and 12) allows for removal of extended fingers 82 from the lead frame 78 (FIG. 12). Utilizing a first, second, and third plurality of bonding wires allows for a fabricator or producer to fabricate a thinner MEMS package.

Figure 6:
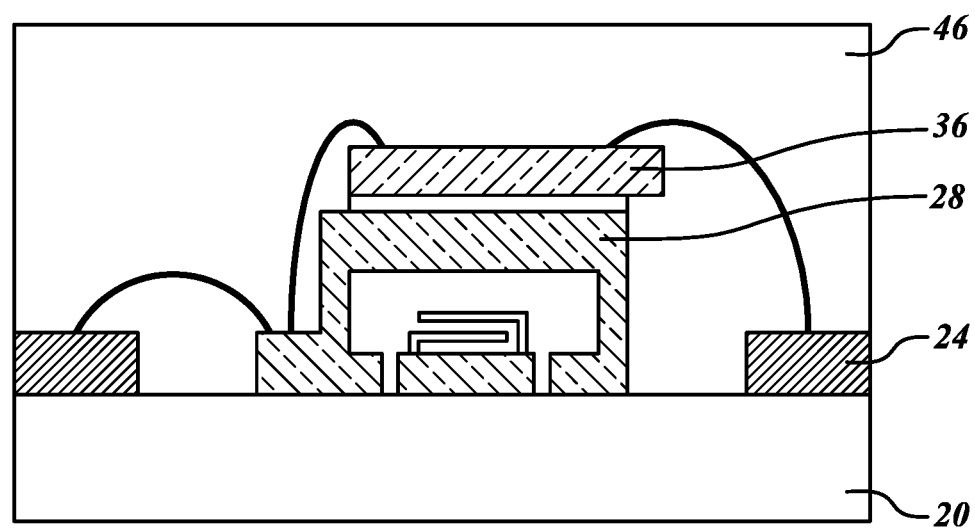

FIG. 6 is a cross-sectional side view showing a molding compound 46 formed to complete the pressure sensor package. The molding compound 46 is formed to partially cover the MEMS semiconductor die 28 and the lead frame 24 and to fully encapsulate the second semiconductor die 36 and the pluralities of bonding wires 40, 42, 44. The molding compound 46 may be an epoxy mold compound, an epoxy resin, or a plastic standard in forming a MEMS package known in the semiconductor industry.

In this embodiment, the molding compound 46 may be formed using a molding machine through pellet transfer molding or compression molding. Pellet transfer molding is the current process used in the semiconductor packaging industry and is when a pellet of material is heated and plunged through a hole to form a MEMS package. The placement of the lead frame 24 on the lead frame tape 20 allows for compression molding to be used as an alternative to pellet transfer molding. Compression molding is when a portion of material is heated and compressed into place to form a MEMS package.

Figure 7:
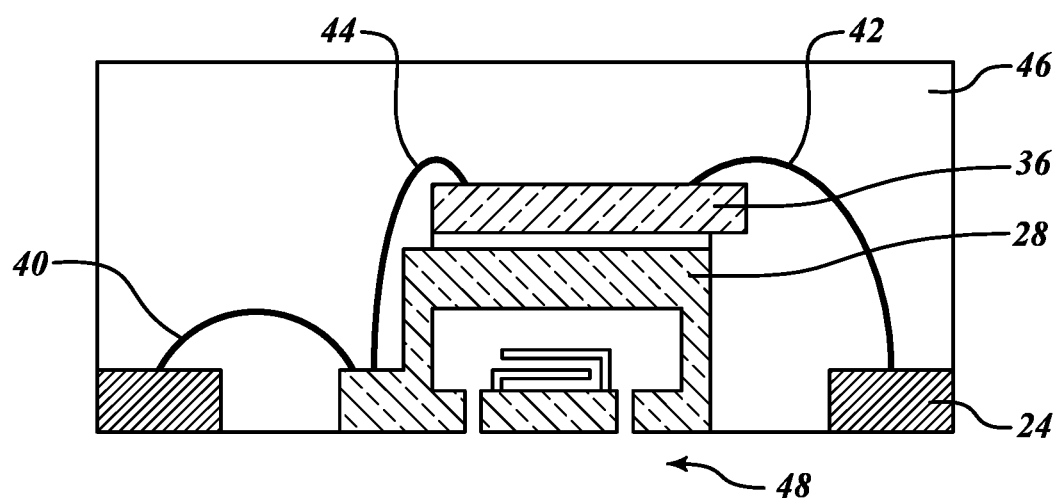
FIG. 7 is a cross-sectional side view of a completed MEMS pressure sensor package according to one embodiment taken along lines 7-7 of FIG. 8.

FIG. 7 shows an embodiment of the complete pressure sensor package. The lead frame tape 20 is removed from the pressure sensor package and exposes the first face of the MEMS semiconductor die 28 and the lead frame 24 to an ambient atmosphere 48. The first face may be a side of the MEMS semiconductor die, a portion of the MEMS semiconductor die, or some other part of the MEMS semiconductor die. The apertures 34 of the MEMS semiconductor die 28 are exposed to the ambient atmosphere 48 after removing the lead frame tape 20. The apertures 34 expose the internal chamber 30 and the sensing component 32 to the ambient atmosphere 48.

In this embodiment, if the MEMS package is to be mounted to a PCB (Printed Circuit Board), then one or more openings will be present in the PCB adjacent to the MEM's die 28 to expose the apertures 34 of the MEMs device to ensure that ambient atmosphere 48 can enter the chamber 30. The package will be mounted with the leads 24 on the PCB with both the apertures 34 and the leads on the same side, facing the PCB. Providing one or more holes in the PCB aligned with the apertures 34 will expose them to the ambient atmosphere 38.

Figure 8:
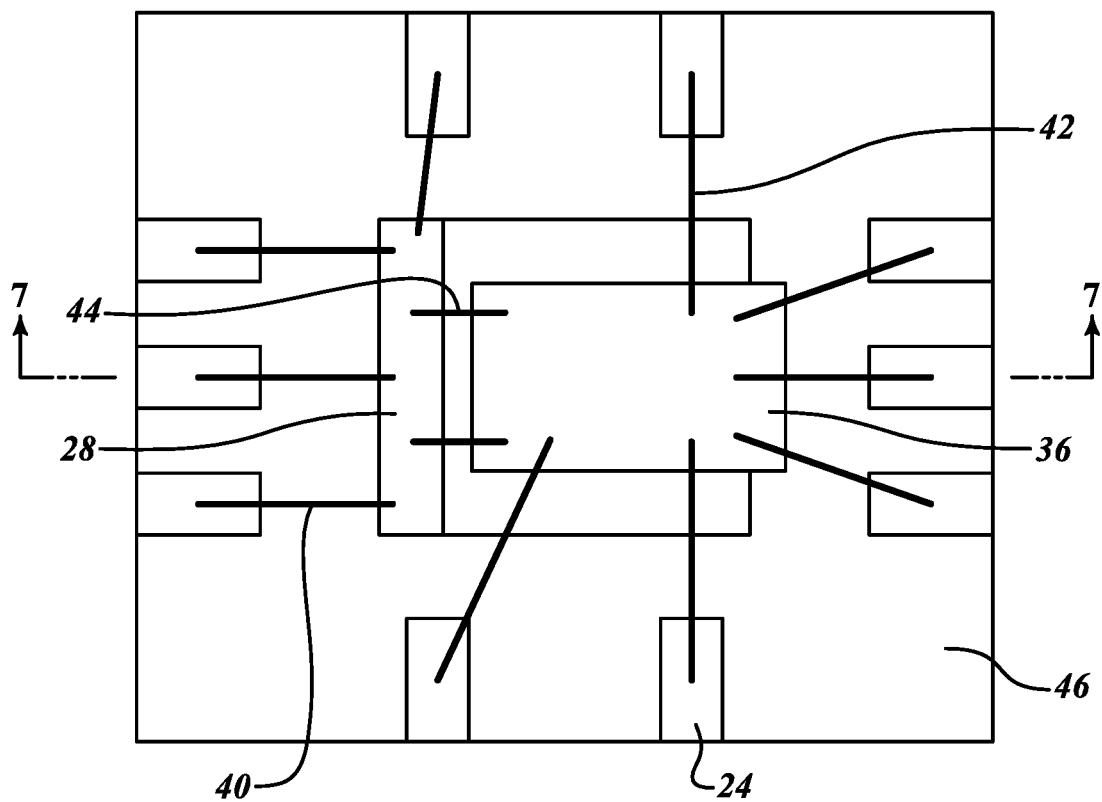
FIG. 8 is a simplified top plane view of the completed MEMS pressure sensor package of FIG. 7 showing various connections of bonding wires within the package in one embodiment.

FIG. 8 shows the connections of the pluralities of bonding wires 40, 42, 44. The first plurality of bonding wires 44 connects the MEMS semiconductor die 28 to the second semiconductor die 36. The second plurality of bonding wires 42 connects the lead frame 24 to the second semiconductor die 36. The third plurality of bonding wires 40 connects the lead frame 24 to the MEMS semiconductor die 28. FIG. 8 shows ten leads of the lead frame 24 connected with bonding wires to both the MEM's and the ASIC die 36. The entire lead frame is not shown since the use and structure of lead frames is known in the art. Each lead, in the end product, is electrically isolated from each other in order to carry separate voltages.

In one embodiment, the bonding wires 40 extend from the individual leads to both the MEMs die 28 and the ASIC die 36, as shown in FIG. 8. In another embodiment, the bonding wires 40 extend from the leads to only the ASIC die 36 and the only wires that extend to the MEMs die 28 are from the ASIC 36.

Figure 9:
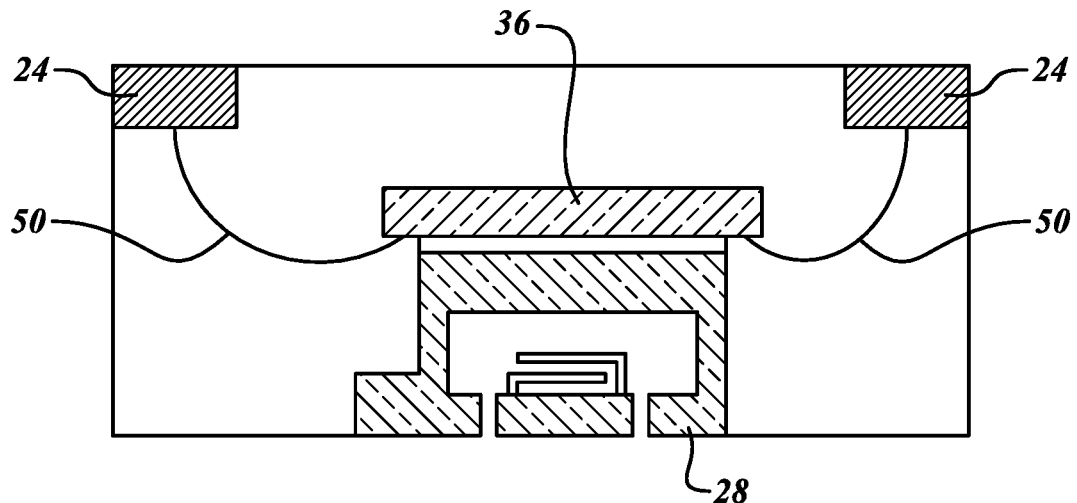
FIG. 9 is a cross-sectional side view of an alternative embodiment of the completed MEMS pressure sensor package shown in FIG. 7.

FIG. 9 shows an alternative embodiment of the complete pressure sensor package. The alternative embodiment has the lead frame 24 placed on the opposite side of the MEMS package from the MEMS semiconductor die 28 in the pressure sensor package and a plurality of bonding wires 50. The plurality of bonding wires 50 connect the lead frame to the second semiconductor die 36.

In this embodiment, a method is used to place the lead frame 24 on the opposite side of the MEMS package from the MEMS semiconductor die 28. The lead frame 24 is placed on the lead frame tape 20. Once the lead frame 24 is placed, a support material is placed in the open region 26 of the lead frame 24 on the lead frame tape 20 and adjacent to the lead frame 24. The support material may be a permanent heat sink, a temporary spacer of removable material, or some other support material known to the semiconductor industry.

Once the support material is placed, the second semiconductor die 36 is then attached to the support material. The second semiconductor die 36 may be attached using an adhesive film. The adhesive film may be a DAF or some other attachment material known in the semiconductor industry.

After the second semiconductor die 36 is attached to the support material, a plurality of bonding wires 50 are connected between the lead frame 24 and the second semiconductor die 36. The plurality of bonding wires 50 may be made of a copper, a copper-alloy, or some other conductive material known to the semiconductor industry.

Next, the MEMS semiconductor die 24 is attached to the second semiconductor die 36 using an adhesive film 38. When the MEMS semiconductor die 24 is attached to the second semiconductor die 46, an electrical connection must be formed. The electrical connection may be formed using a metal DAF layer, metal pillar connectors between the dice, a plurality of bonding wires, wire-bond interconnects, or some other technique of forming electrical connections between dice known to the semiconductor industry. The MEMS semiconductor die 24 has an internal chamber 30, a sensing component 32, and apertures 34. The MEMS semiconductor die 28 is placed in a manner such that at least one portion of the MEMS semiconductor die 28 is thereof exposed to the ambient atmosphere 48 after the later molding process. The one portion of the MEMS semiconductor die 28 has a plurality of apertures 34. The plurality of apertures 34 will be exposed to the ambient atmosphere 48 after the later molding process.

A second lead frame tape is then placed on the MEMS semiconductor die 28. The second lead frame tape may be made of one or more layers of non-conductive adhesive and polyimide material. The second lead frame tape seals and protects the apertures 34 and the internal chamber 30 during the later molding process. Once the second lead frame tape has been placed, a molding compound 46 is injected using an injection molding process between the lead frame tape 20 and the second lead frame tape. Injection molding is when a heated material is pushed through a small hole to form the MEMS package.

Once the molding compound 46 has formed, the lead frame tape 20 and the second lead frame tape are removed. Removal of the lead frame tape 20 exposes the lead frame 24 to the ambient atmosphere 48. Removal of the second lead frame tape exposes the plurality of apertures 34 of the MEMS semiconductor die 28 to the ambient atmosphere 48. The plurality of apertures 34 exposes the internal chamber 30 and the sensing component 32 to the ambient atmosphere 48. When the lead frame tape 20 is removed, the support material may stay in place or be removed with the lead frame tape 20.

In this embodiment and method, the placement of the lead frame 24 opposite to the MEMS semiconductor die 28 removes the need for holes in a PCB's footprint corresponding to the apertures 34 if the MEMS pressure sensor package was to be mounted to a PCB.

In a similar method to the method above, the second semiconductor die 36 is instead placed directly on the lead frame tape 20 in the open region 26 of the lead frame 24 and adjacent to the lead frame 24. That is, the second semiconductor die 36 is placed on the opposite side of the package from the MEMS semiconductor die 28. Thus, removal of the lead frame tape 20 exposes the lead frame 24 and the second semiconductor die 36 to the ambient atmosphere.

In this embodiment and similar method, the placement of the lead frame 24 and second semiconductor die 36 opposite to the MEMS semiconductor die 28 in the package, and the placement of the second semiconductor die 36 adjacent to the lead frame 20, similarly remove the need for holes in a PCB's footprint corresponding to the apertures 34 if the MEMS pressure sensor package is to be mounted to a PCB. In addition, the placement of the second semiconductor die 36 adjacent to the lead frame 20 further reduces the molding compound 46 needed to produce the MEMS packages, in turn, allowing a fabricator, producer, or manufacturer to produce even thinner MEMS packages. Also, the placement of the second semiconductor die 36 on the lead frame tape 20 removes the need for a heat sink or a temporary support material. Thus, utilizing a placement of a second semiconductor die on a lead frame tape within an open region of a lead frame on an opposite side of a package from a MEMS semiconductor die allows for an even thinner MEMS package to be produced with less material.

Figure 10:
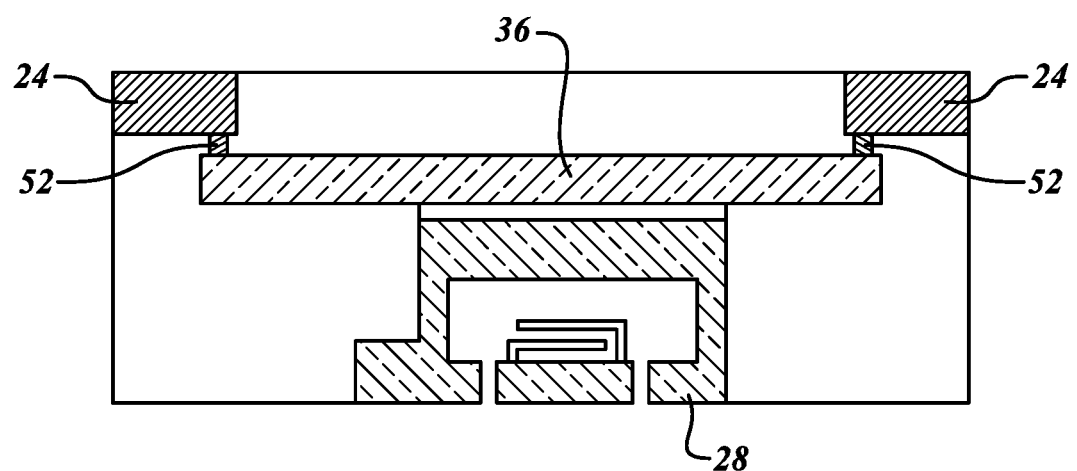
FIG. 10 is a cross-sectional side view of an alternative embodiment of the completed MEMS pressure sensor package shown in FIG. 7.

FIG. 10 shows an alternative embodiment of the complete pressure sensor package. The alternative embodiment has the lead frame 24 placed opposite to the MEMS semiconductor die 28 in the pressure sensor package and a plurality of electronic connectors 52. The electronic connectors 52 may be solder ball or metal pillar connectors to connect the lead frame 24 to the second semiconductor die 36.

In this embodiment, the placement of the lead frame opposite to the MEMS semiconductor die 28 removes the need for holes in a PCB's footprint corresponding to the apertures 34 if the MEMS pressure sensor package was to be mounted to a PCB.

FIG. 11 shows prior art that has a substrate base layer 54 that contains a lead frame 56. The substrate base layer 54 is attached to a first semiconductor die 60 by a first DAF layer 58. The first semiconductor die 60 is attached to a MEMS semiconductor die 64 by a second DAF layer 62. The MEMS semiconductor die 64 has an internal chamber 66, a sensing component 68, and apertures 70. The MEMS semiconductor die 64 is exposed to the ambient atmosphere 48. The apertures 70 are exposed to the ambient atmosphere 48. The apertures 70 expose the internal chamber 66 and the sensing component 68 to the ambient atmosphere 48. A first and second plurality of bonding wires 72 connect the lead frame 56 to the first semiconductor die 60 and connect the first semiconductor die 60 to the MEMS semiconductor die 64. A molding compound 74 is formed that partially covers the lead frame 56 and the MEMS semiconductor die 64 and encapsulates the first and second plurality of bonding wires 72 and the first semiconductor die 60.

In this prior art, the second semiconductor die 64 and the apertures 70 are at risk of mold flashing as the apertures 70 are not protected or covered when the molding compound 74 is applied. Mold flashing results when the molding compound 46, 74, 100 is distributed incorrectly and covers the apertures 34, 70, 96. This incorrect distribution results in a useless MEMS pressure sensor or MEMS device. The causes of mold flashing include uneven die height, not enough clamping pressure in the molding process, and unoptimized transfer plunger packing pressure. In addition, in this prior art, the MEMS semiconductor die 64 is at risk of die cracking as the molding compound 74 is pushed into place by a molding compound machine. The molding compound machine applies direct pressure on the MEMS semiconductor die 64 creating a higher risk of die cracking.

FIG. 12 shows prior art that has a lead frame tape 76. The lead frame tape 76 is attached to a lead frame 78 and a molding compound base layer 80. The lead frame 78 has extended fingers 82. The extended fingers 82 are attached to a first semiconductor die 86 by a first DAF layer 84. The attachment of the first semiconductor die 86 to the extended fingers 82 is known in the semiconductor industry as a COL (Chip on Leads) design. The first semiconductor die 86 is attached to a MEMS semiconductor die 90 by a second DAF layer 88. The MEMS semiconductor die 90 has an internal chamber 92, a sensing component 94, and apertures 96. The MEMS semiconductor die 90 is exposed to the ambient atmosphere 48. The apertures 96 are exposed to the ambient atmosphere 48. The apertures 96 expose the internal chamber 92 and the sensing component 94 to the ambient atmosphere 48. A first and second plurality of bonding wires 98 connect the lead frame 78 to the first semiconductor die 86 and the first semiconductor die 86 to the MEMS semiconductor die 90. A molding compound 100 is formed to partially cover the lead frame 78 and the MEMS semiconductor die 90, and the molding compound 100 is formed to fully encapsulate the first and second plurality of bonding wires 98 and the first semiconductor die 86.

In this prior art, the MEMS semiconductor die 90 and the apertures 96 are at risk of mold flashing due to the apertures 96 not being protected or covered as the molding compound 100 is applied. In addition, the MEMS semiconductor die 90 is at risk of die cracking as the molding compound 100 is pushed into place by a molding compound machine.

The method and apparatus claimed reduces the chances of mold flashing compared to the prior art. In the prior art, for example, if the molding compound 74, 100 is distributed incorrectly, the molding compound 74, 100 will likely cover the apertures 70, 96. By placing the MEMS semiconductor die 28 in a manner such that the apertures 34 face the lead frame tape 20, even if the molding compound 46 distributes incorrectly, the likelihood the molding compound 46 can cover the apertures 34 is reduced by the lead frame tape 20 covering, protecting, and sealing the apertures from the molding compound 46.

The method and apparatus claimed reduces the chances of die cracking. The causes of die cracking include high clamping pressure and mismatch between die height and mold cap (high die height or shallow mold cap). Placing the MEMS semiconductor die 28 in a manner such that a molding compound machine applies direct pressure to the molding compound 46 instead of the MEMS semiconductor die 28 reduces the chances of die cracking.

The method and apparatus claimed allows for pellet transfer molding and compression molding. Pellet transfer molding is the semiconductor industry standard for fabricating MEMS packages, but compression molding would be another process that the semiconductor industry could take advantage of as a result of placing the MEMS semiconductor die 28 on the lead frame tape 20 during MEMS package fabrication. Pellet transfer molding is when a portion of material is heated and plunged through a hole to form a MEMS package. Compression molding is when a portion of material is heated and compressed into place to form a MEMS package. In addition, in an alternative method, a second lead frame tape may be utilized allowing an injection molding process to be used, further reducing the chances of mold flashing and die cracking.

The method and apparatus claimed offers a thinner package profile compared to the prior art. For the prior art to be fabricated, a substrate base layer 54 (FIG. 11) or a molding compound base layer 80 (FIG. 12) is needed. In this new design, a thinner package can be fabricated by using the lead frame tape 20 as a base layer. Using the lead frame tape 20 as a base layer removes material from the prior art packages needed for fabrication, for example, the die pad 82 of the lead frame 78 (FIG. 12), the molding compound base layer 80 (FIG. 12), and the substrate base layer 54 (FIG. 11). In addition, in the prior art, two DAF layers 58, 62, 84, 88 are needed to produce the package. Thus, in this new design, utilizing a lead frame tape as a base layer allows for one of the DAF layers to be removed allowing for an even thinner MEMS package.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a package having a first side and a second side that faces away from the first side, the package including:
   a MEMS semiconductor on the first side of the package, the MEMS semiconductor die including:
   a first surface exposed on the first side of the package;

an internal chamber;
a sensing component within the internal chamber; and
an aperture extending into the first surface of the MEMS semiconductor die, the aperture extending from the first surface of the MEMS semiconductor die to the internal chamber;
a lead frame on the second side of the package, the lead frame including a first lead and a second lead spaced apart from the first lead, the first lead having a first exposed surface and the second lead having a second exposed surface;
a molding compound partially covering the MEMS semiconductor die and the lead frame, the first surface of the MEMS semiconductor die being flush with the molding compound at the first side of the package, the first exposed surface of the first lead flush with the molding compound at the second side of the package, and the second exposed surface of the second lead flush with the molding compound at the second side of the package; and
a second semiconductor die within the molding compound, the second semiconductor die coupled to the first lead and the second lead, and the second semiconductor die coupled to the MEMS semiconductor die.

2. The device of claim 1, wherein the second semiconductor die is positioned between the MEMS semiconductor die and the first and second leads of the lead frame.

3. The device of claim 1, wherein the second semiconductor die overlaps the first lead and the second lead.

4. The device of claim 3, further comprising:
a first connector extending from the second semiconductor die to the first lead; and
a second connector extending from the second semiconductor die to the second lead.

5. A device, comprising:
a package having a first side and a second side that faces away from the first side, the package including:
a MEMS semiconductor on the first side of the package, the MEMS semiconductor die including:
a first surface exposed at the first side of the package;
a second surface facing away from the first surface;
an internal chamber;
a sensing component within the internal chamber; and
an aperture extending into the first surface of the MEMS semiconductor die, the aperture extending from the first surface of the MEMS semiconductor die to the internal chamber;
a lead frame on the second side of the package, the lead frame having a third surface and a fourth surface facing away from the third surface, the third surface is exposed at the second side of the package;
a second die including a fifth surface and a sixth surface, the fifth surface coupled to the second surface of the MEMS semiconductor die by a conductive adhesive that electrically couples the second die to the MEMS semiconductor die;
a molding compound partially covering the MEMS semiconductor die and the lead frame, the first surface of the MEMS semiconductor die being flush with the molding compound at the first side of the package, the fourth surface of the lead frame being flush with the molding compound at the second side of the package; and
a plurality of electrical connectors coupling the third surface of the lead frame to the sixth surface of the second die, the plurality of electrical connectors electrically coupling the lead frame to the second die.

6. The device of claim 5, wherein the second die includes first contact pads on the fifth surface of the second die and second contact pads on the sixth surface of the second die, the first contact pads coupled to the second contact pads through electrical vias.

7. The device of claim 5, wherein the sensing component is a pressure sensor.

8. The device of claim 5, wherein the aperture exposes the internal chamber and the sensing component to an external environment.

9. The device of claim 5, wherein the lead frame includes a plurality of leads and an open region between the respective leads of the plurality of leads.

10. The device of claim 9, wherein the second die extends to each respective lead of the plurality of leads and is electrically coupled to each lead of the plurality of leads through the plurality of electrical connectors.

11. The device of claim 9, wherein each respective electrical connector is at least one of a solder ball or a metal pillar connector.

12. A device, comprising:
a molding compound having a first side a second side opposite to the first side;
a MEMS semiconductor in the molding compound, the MEMS semiconductor including:
a first surface exposed from the first side of the molding compound;
a second surface opposite to the first surface and facing away from the first surface;
an internal chamber;
a sensing component within the internal chamber; and
an aperture extending into the first surface to the internal chamber;
a lead frame in the molding compound and at the second side of the package, the lead frame having a third surface exposed from the molding compound and a fourth surface opposite to the third surface;
a second die in the molding compound, the second die including a fifth surface exposed from the molding compound and a sixth surface opposite to the fifth surface, the fifth surface of the second die is coupled to the second surface of the MEMS semiconductor; and
a plurality of electrical connection structures are coupled to the second die and the lead frame.

13. The device of claim 12, wherein the aperture includes an opening at the first surface of the MEMS semiconductor, and the first surface and the opening are flush with the first side of the molding compound.

14. The device of claim 12, wherein the second die is an application-specific integrated circuit (ASIC) die.

15. The device of claim 12, wherein the plurality of electrical connection structures are a plurality of wires.

16. The device of claim 15, wherein the plurality of wires have first ends coupled to the fourth surface of the lead frame, and second ends coupled to the fifth surface of the second die.

17. The device of claim 12, wherein the plurality of electrical connection structures are a plurality of conductive pillar connectors.

18. The device of claim 17, wherein the plurality of conductive pillar connectors extend from the fourth surface of the lead frame to the sixth surface of the second die.

19. The device of claim 18, wherein the second die extends from a first portion of the lead frame at a first sidewall of the molding compound to a second portion of the lead frame at a second sidewall of the molding compound, and the first and second sidewalls are transverse to the first and second sides and the first and second sidewalls extend from the first side to the second side.

20. The device of claim 19, wherein the first and second portions are first and second leads of the lead frame.

* * * * *